United States Patent [19]

Majumdar

[11] Patent Number: 4,777,386

[45] Date of Patent: Oct. 11, 1988

[54] DRIVER CIRCUIT FOR A BIPOLAR DARLINGTON POWER TRANSISTOR

[75] Inventor: Gourab Majumdar, Itami, Japan

[73] Assignee: Mitsubishi Denki Kabushiki Kaisha, Tokyo, Japan

[21] Appl. No.: 110,588

[22] Filed: Oct. 19, 1987

Related U.S. Application Data

[63] Continuation of Ser. No. 795,459, Nov. 6, 1985, abandoned.

[30] Foreign Application Priority Data

Nov. 6, 1984 [JP] Japan ................... 59-233719

[51] Int. Cl.⁴ ............... H03K 3/26; H03K 3/33; H03K 23/08
[52] U.S. Cl. ................... 307/270; 307/300; 307/315; 307/296 R
[58] Field of Search .......... 307/270, 315, 300, 289, 307/296.1, 551; 357/46

[56] References Cited

U.S. PATENT DOCUMENTS

| | | | |
|---|---|---|---|
| 2,892,952 | 6/1955 | McVey | 307/263 |
| 3,751,680 | 8/1973 | Hodges | 307/317 A |
| 4,112,314 | 5/1978 | Gani et al. | 307/317 A |
| 4,239,988 | 12/1980 | Akamatsu | 307/315 |
| 4,400,635 | 8/1983 | Mazay | 307/317 A |
| 4,482,911 | 11/1984 | Quoirin | 357/46 |

OTHER PUBLICATIONS

"Storage Times and Fall Times of Darlington Transistors for Various Methods of Turn-Off", by Merle Morozowich, PCI, Apr. 1984.
European Search Report, Application No. EP 85 30 8066, Documents considered to be relevant.
Electronique Industrielle, No. 9, Feb. 1, 1981, pp. 21-23, Paris, FR; P. Aloisi.
Electronique Applications, No. 31, Aug.-Sep. 1983, pp. 35-44, Evry, FR; K. K. Rischmuller.

*Primary Examiner*—Stanley D. Miller
*Assistant Examiner*—B. P. Davis
*Attorney, Agent, or Firm*—Birch, Stewart, Kolasch & Birch

[57] ABSTRACT

A driver circuit for a bipolar Darlington power transistor includes a current clamping device which is provided between the base and emitter of said transistor and makes the base-emitter path of said transistor operate at a shallow saturated region; and a cut off device which is provided at the side of said emitter and cuts-off said transistor in response to a signal given from a driving power source.

11 Claims, 2 Drawing Sheets

DRIVER CIRCUIT FOR A BIPOLAR DARLINGTON POWER TRANSISTOR

This application is a continuation, of application Ser. No. 795,459 filed on Nov. 6, 1985, now abandoned.

FIELD OF THE INVENTION

The present invention relates to a driver circuit for a bipolar Darlington power transistor, and more particularly to a driver circuit for switching a bipolar Darlington power transistor at a high speed and at a high frequency.

BACKGROUND OF THE INVENTION

In order to explain the background of the invention, reference will be particularly made to FIG. 2 which shows a prior art base drive circuit for switching a bipolar Darlington power transistor at a high speed:

The bipolar Darlington power transistor 2 which is driven by the current from the base drive circuit 1 is constituted by NPN bipolar transistors Q1 and Q2 in Darlington connection, a diode 3 and a resistor 4 for speeding up the operation of the transistors Q1 and Q2, and a flywheel diode 5 for absorbing the commutation current at the turn-off. The anode of the diode 3 is connected to the emitter of the transistor Q1, and the cathode of the diode 3 is connected to the base of the transistor Q1. The resistor 4 is provided connected between the base and the emitter of the transistor Q2. The one end of the resistor 4 is connected to the anode of the diode 3 and the base of the transistor Q2 (the emitter of the transistor Q1). The cathode of the flywheel diode 5 is connected to the collector of the transistor Q2, and the anode of the flywheel diode 5 is connected to the emitter of the transistor Q2.

A driver circuit for driving the bipolar Darlington power transistor 2 at a high speed and at a high frequency is constituted by a high speed switching diode 7 which applies a regular direction base current from the base drive circuit 1 to the base of the transistor Q1 of the Darlington power transistor 2, a Baker clamp diode 6 for applying a regular direction extra base current to the collector of the transistor 2, and a high speed switching diode 8 for discharging the reverse direction base current from the transistor 2. The regular direction voltage drop of the Baker clamp diode 6 and that of the high speed switching diode 7 are preferably made equal to each other.

This circuit is operated as follows:

Firstly, the operation at the turning-on is described. The transistor 2 is turned on by the regular direction base current given through the high speed switching diode 7 from the base drive circuit 1, and the collector current begins to be flow. The base-collector path of the transistor 2 becomes regular biased because the base-emitter path thereof is already saturated. The sum of the regular bias voltage between the base and collector thereof and the regular voltage drop of the high speed switching diode 7 becomes larger than the regular voltage drop of the Baker clamp diode 6, and the diode 6 is turned on, whereby the extra base current is given to the collector of the transistor 2 through the Baker diode 6. As a result, even if the base current increases, the transistor 2 always operates in an unsaturated or quasi-saturated region.

At the time of turn-off a reverse direction base current is given to the base of the transistor 2 through the diode 8. The transistor 2 is operated in an unsaturated or quasi-saturated region, and the storage time is almost zero, thereby enabling a high speed response. The reverse direction current which occurs in a case where an inductive load is absorbed through the flywheel diode 5, or the resistor 4 and the diode 3.

In this way, the prior art bipolar Darlington power transistor under such a construction operates at a high speed and a high frequency.

It is a requirement that the Baker clamp diode 6 used in the circuit of FIG. 2 have the same blocking voltage rating as the voltage rating between the collector and base of the Darlington power transistor 2. Furthermore, it is required for the Baker clamp diode 6 and the high speed switching diode 7 to have equal regular voltage drops. However, when the blocking voltage rating of the power transistor 2 becomes large, it is quite difficult to obtain diodes which satisfy both of these requirements.

Furthermore, when the current flowing through the base of the transistor 2 is not too large, there is scarcely an advantage in making the transistor 2 operate in an unsaturated region by bypassing the extra base current with the Baker diode 6.

Another prior art bipolar Darlington power transistor is disclosed in an article "Storage times and fall times of Darlington transistors for various method of turn-off", by Merle Morozowich, PCI April, 1984 Proceedings. This article discloses that the storage and fall times directly affect the frequency of operation and that the fall time directly affects the switching power dissipation. This study will enable the design engineer to predict storage and fall times and assist in choosing a safe frequency of operation at minimum power dissipation for all high voltage Darlington power transistors.

SUMMARY OF THE INVENTION

The present invention is directed to solve the problems pointed out above, and has for its object to provide a driver circuit for a bipolar Darlington power transistor capable of decreasing the turn-off loss and enabling high frequency operation up to several tens of KHz.

Another object of the present invention is to provide a driver circuit for a bipolar Darlington power transistor capable of being constituted by easily available elements.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a driver circuit for a bipolar Darlington power transistor, which comprises: a current clamping means which, provided between the base and emitter of said transistor, makes the base-emitter path of said transistor operate at a shallow saturated region; and a cutting off means which, provided at the side of said emitter, cuts-off said transistor in response to a signal given from the driving power source.

DETAILED DESCRIPTION OF THE PREFERRED EMBODIMENTS

Figure 1:
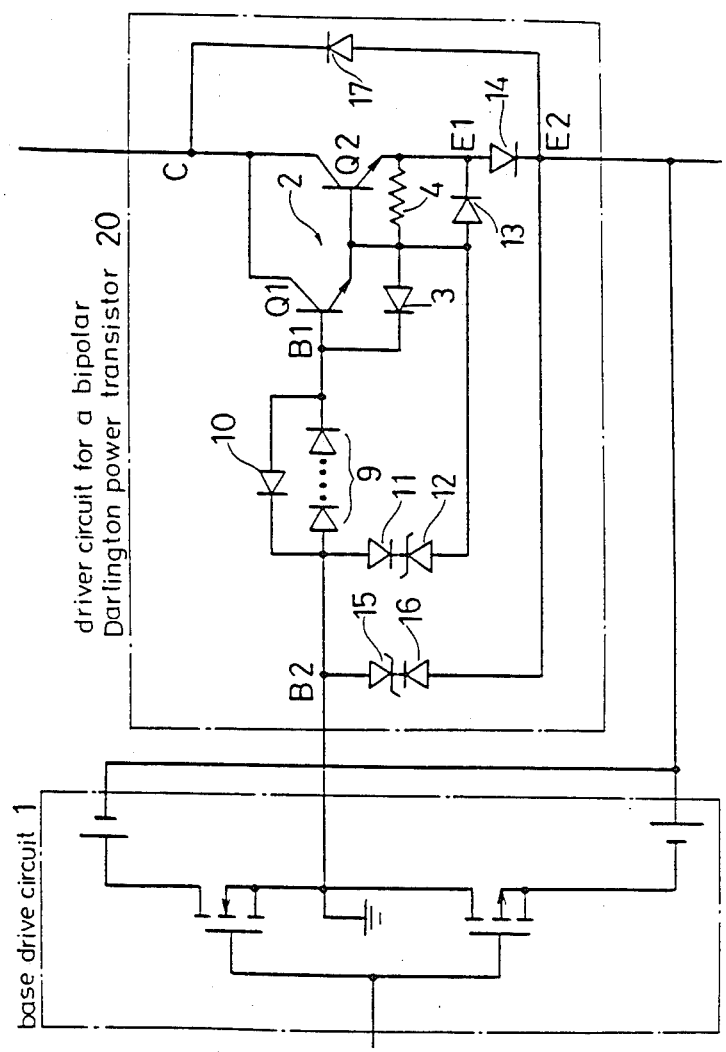
FIG. 1 is a schematic diagram showing a driver circuit for a bipolar Darlington power transistor as one embodiment of the present invention.
Figure 2:
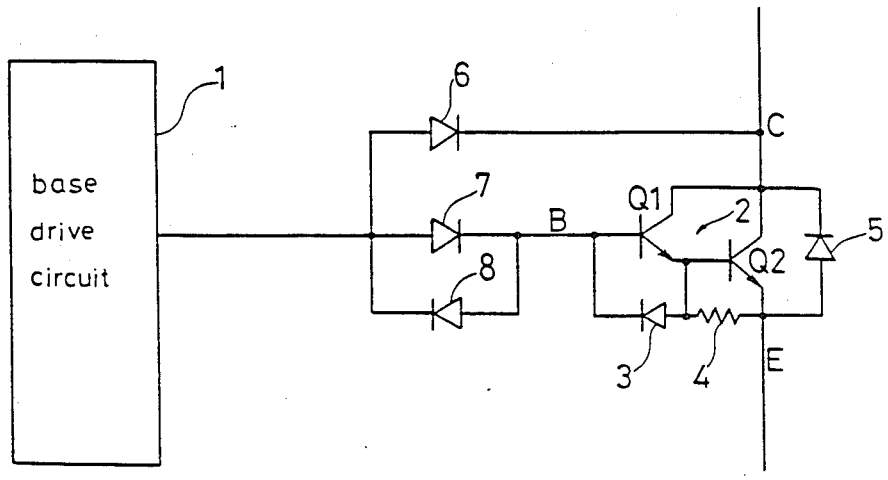
FIG. 2 is a schematic diagram showing a prior art driver circuit for a bipolar Darlington power transistor.

In order to explain the present invention in detail, reference will be particularly made to FIG. 1:

The power transistor in Darlington connection 2 operates with receiving the signal from the base drive circuit 1 at between the base and the emitter thereof. The output stage of the base drive circuit 1 is constituted by an n-channel MOSFET and a p-channel MOSFET connected to each other complimentarily. Between a base input terminal $B_2$ of the base drive circuit 1 and the main base terminal $B_1$ of the transistor 2 there are provided a plurality of high speed switching diodes 9 as a voltage drop means connected in series in regular direction viewed from the base input terminal $B_2$. A high speed switching diode 10 is connected reversely parallel with the high speed switching diodes 9 so as to bypass the reverse base current. Between the anode of the first diode among the high speed switching diodes 9 viewed from the base input terminal $B_2$ and the emitter terminal $E_1$ of the transistor 2 there are provided a high speed switching diode 11 in regular direction viewed from the base input terminal $B_2$, a Zener diode 12 in reverse direction, and a high speed switching diode 13 in regular direction connected in series together, thereby constituting a current clamping circuit means.

Furthermore, between the base input terminal $B_2$ of the base drive circuit 1 and the output emitter terminal $E_2$ of the base drive circuit 1 there are provided a Zener diode 15 in regular direction viewed from the input base terminal $B_2$ and a high speed switching diode 16 in reverse direction connected in series to each other so as to apply a reverse bias to between the base and emitter of the transistor 2.

Between the main emitter terminal $E_1$ of the transistor 2 and the output emitter terminal $E_2$ of the base drive circuit 1 there is provided a high speed recovery Schottky barrier diode 14 in reverse direction viewed from the output emitter terminal $E_2$ so as to cut off the transistor 2 at a high speed.

Between the emitter corresponding terminal $E_2$ of the base drive circuit 1 and the collector terminal C of the transistor 2 there is provided a flywheel diode 17 for absorbing the commutation current of the load current at the turn-off of the transistor 2.

This circuit is operated as follows:

Firstly, the operation at the turn-on of the transistor 2 is described. The transistor 2 is turned on by the base current given through a plurality of diodes 9 from the base drive circuit 1, and the collector current is begins to flow. Then the base-emitter path of the transistor 2 becomes saturated prior to the base-collector path thereof, and the base-emitter path becomes regular biased. When the sum of the regular bias voltage of the transistor 2 and the regular voltage drop of the diode 9 becomes larger than the sum of the regular voltage drops of the diodes 11 and 13 and the Zener voltage of the Zener diode 12, the base current flows through the diode 11, the Zener diode 12, and the diode 13. Accordingly, the regular base current cannot become larger than a predetermined value by the clamping function of the diode 11, the Zener diode 12, and the diode 13, whereby the base of the transistor 2 is not overdriven. Thus, a current larger than the saturation current of the base-emitter path does not flow through the base of the transistor 2, whereby the collector-base path of the transistor 2 is not saturated. As a result, storage charges do not occur at the base-collector path of the transistor 2.

Next, the operation at the turn-off of the transistor 2 is described. First, a negative voltage having an absolute value larger than the sum of the break down voltage of the Zener diode 15 and the regular voltage drop of the high speed switching diode 16 is given to the base-emitter path of the transistor 2 from the base drive circuit 1. Then a reverse bias current flows from the emitter corresponding terminal $E_2$ of the base drive circuit 1 to the base terminal $B_2$ of the base drive circuit 1 through the diode 16 and the Zener diode 15. As a result, a reverse bias voltage having the value of the sum of the break down voltage of the Zener diode 15 and the regular voltage drop of the diode 16 (hereinafter referred to as a voltage "$V_R$") is applied between the anode and cathode of the high speed recovery Schottky barrier diode 14. By this reverse bias voltage, the high speed recovery Schottky barrier diode 14 is reversely recovered at a high speed and is turned-off. Thus, the circuit at the side of the emitter of the Darlington power transistor 2 is cut off, thereby getting rid of the load current. That is, the transistor 2 is turned off at the same speed as that of the high speed recovery Schottky barrier diode 14. Hereupon, the base-emitter path of the transistor 2 is in a state where a reverse bias voltage is applied thereto by the voltage $V_R$ at the turn-off, thereby enabling a reduction in the turn-off time of the transistor 2.

On the other hand, it is considered that even if a clamping function is carried out by the Zener diode 12 at the turn-on of the transistor 2, a minute current flows through the base-collector path of the transistor 2, whereby storage charges are stored. In this case, however, the storage charges are discharged to the base drive circuit 1 through the base terminal $B_1$ and the high speed switching diode for bypassing the reverse base current 10 by the reverse bias voltage applied to the transistor 2 at the turn-off of the transistor 2.

As is evident from the foregoing, according to the present invention, there is provided a Zener diode for clamping the base-emitter path of the bipolar power transistor in Darlington connection, a Schottky barrier diode for cutting off the emitter circuit of the bipolar power transistor at a high speed, and a high speed switching diode for discharging the storage charges. Therefore, it is possible to ignore the influences of the storage charges, and furthermore to reduce the turn-off time of the bipolar transistor to a great extent by use of the Schottky barrier diode, whereby a switching circuit capable of operating at a high speed and a high frequency is obtained.

What is claimed is:

1. A driver circuit for a bipolar Darlington power transistor having a main base, a main emitter and main collector, which comprises:

current clamping means, connected between a base input and the main emitter of said transistor, for operating the main base-main emitter path of the transistor at a shallow saturated region, said base input being operatively connected to said main base; and cut-off means, connected to said main emitter for turning-off the transistor in response to a signal given from a driving power source;

said current clamping means including a first constant voltage Zener diode connected in reverse direction viewed from said base input.

2. A driver circuit for a bipolar Darlington power transistor having a main base, a main emitter and a main collector, which comprises:

current clamping means, connected between a base input and the main emitter of said transistor, for operating the main base-main emitter path of the transistor at a shallow saturated region, said base input being operatively connected to said main base, wherein said circuit clamping means includes a first constant voltage diode connected in reverse direction viewed from said base input; and cut-off means, connected to said main emitter for turning-off the transistor in response to a signal given from a driving power source, wherein said cut-off means is connected between said base input and the main emitter and includes a second constant voltage diode connected in regular direction viewed from said base input, and a high speed restoring Schottky barrier diode which is selectively turned on and off in accordance with a signal level difference produced between the first and second constant voltage diodes.

3. A driver circuit for a power transistor of a Darlington configuration having a main base, a main emitter and a main collector, which comprises:

clamping means, connected between a base input and the main emitter, for preventing a base current of the transistor from exceeding a preselected level, said base input being operatively connected to said main base; and cut-off means, connected between said base input and the main emitter, for turning off the transistor in response to a signal produced by a driving power source;

said clamping means including a first constant voltage Zener diode.

4. The driver circuit of claim 3 further comprising a plurality of high speed switching diodes connected between said base input and the main base in a regular direction viewed from said base input.

5. The driver circuit of claim 3 wherein said clamping means further includes a plurality of diodes connected in a regular direction when viewed from said base input.

6. The driver circuit of claim 5 wherein an anode of said first constant voltage zener diode is connected to an anode of one of said plurality of diodes and to a base of an output one of two transistors constituting the Darlington configuration.

7. A driver circuit for a power transistor of a Darlington configuration having a main base, a main emitter and a main collector, which comprises:

clamping means, connected between a base input and the main emitter, for preventing a base current of the transistor from exceeding a preselected level, said base input being operatively connected to said main base, wherein said clamping means includes a first constant voltage diode; and cut-off means, connected between said base input and the main emitter, for turning off the transistor in response to a signal produced by a driving power source, wherein said cut-off means includes a second constant voltage diode and a high speed restoring Schottky barrier diode which is selectively turned on and off in accordance with a signal level difference produced between said first and second constant voltage diodes.

8. The driver circuit of claim 7 wherein said first constant voltage zener diode is connected in a reverse direction viewed from said base input and said second constant voltage diode is also a zener diode connected in a regular direction viewed from said base input.

9. The driver circuit of claim 7 wherein said high speed restoring Schottky barrier diode is connected to the main emitter and to an output emitter in a regular direction viewed from the main emitter.

10. A driver circuit for a power transistor of a Darlington configuration having a main base and a main emitter, which comprises:

clamping means, connected between a base input and the main emitter, for preventing a base current of the transistor from exceeding a preselected level, said base input being operatively connected to said main base, wherein said clamping means includes a first constant voltage diode;

cut-off means, connected between said base input and the main emitter, for turning off the transistor in response to a signal produced by a driving power source; and a plurality of high speed switching diodes connected between said base input and the main base in a regular direction viewed from said base input;

wherein said cut-off means includes a second constant voltage diode and a high speed restoring barrier diode which is selectively turned on and off in accordance with a signal level difference produced between said first and second constant voltage diodes.

11. The driver circuit of claim 10 further comprising a high speed switching diode connected reversely parallel with said plurality of high speed switching diodes.

* * * * *